United States Patent
Zeng et al.

(10) Patent No.: US 8,488,316 B2
(45) Date of Patent: Jul. 16, 2013

(54) POWER MODULE

(75) Inventors: Jian-Hong Zeng, Taoyuan Hsien (TW);
Shou-Yu Hong, Taoyuan Hsien (TW);
Qi-Feng Ye, Taoyuan Hsien (TW);
Xue-Tao Guo, Taoyuan Hsien (TW);
Ai-Xing Tong, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 295 days.

(21) Appl. No.: 13/074,539

(22) Filed: Mar. 29, 2011

(65) Prior Publication Data
US 2012/0014059 A1 Jan. 19, 2012

(30) Foreign Application Priority Data

Jul. 15, 2010 (CN) .......................... 2010 1 0230158

(51) Int. Cl.
*H05K 7/20* (2006.01)
(52) U.S. Cl.
USPC ........... 361/690; 361/704; 361/707; 361/715; 361/717; 257/666; 257/706; 257/707; 257/712
(58) Field of Classification Search
None
See application file for complete search history.

(56) References Cited

U.S. PATENT DOCUMENTS

| | | | | |
|---|---|---|---|---|
| 5,698,899 | A * | 12/1997 | Hirakawa et al. | 257/712 |
| 6,979,909 | B2 * | 12/2005 | Shinohara | 257/796 |
| 7,061,080 | B2 * | 6/2006 | Jeun et al. | 257/676 |
| 7,449,726 | B2 * | 11/2008 | Nakanishi et al. | 257/177 |
| 7,449,774 | B1 * | 11/2008 | Jeun et al. | 257/712 |
| 7,719,092 | B2 * | 5/2010 | Takubo | 257/659 |
| 7,800,224 | B2 * | 9/2010 | Lee et al. | 257/724 |
| 7,863,725 | B2 * | 1/2011 | Jong et al. | 257/691 |
| 7,884,455 | B2 * | 2/2011 | Sasaki et al. | 257/678 |
| 8,193,633 | B2 * | 6/2012 | Mimura et al. | 257/707 |
| 2003/0057573 | A1 * | 3/2003 | Sekine et al. | 257/787 |
| 2010/0013086 | A1 * | 1/2010 | Obiraki et al. | 257/693 |

\* cited by examiner

*Primary Examiner* — Boris Chervinsky
(74) *Attorney, Agent, or Firm* — Muncy, Geissler, Olds & Lowe, PLLC

(57) ABSTRACT

A power module includes a first power chip and a second power chip, each of which has at least two electrodes. The power module is applied to a power converter having a power density higher than 15 W/inch$^3$ and a maximum efficiency higher than 92%, or to a power converter having a power density higher than 20 W/inch$^3$ or having a maximum efficiency higher than 93%. At least one of the power chips operates at a frequency higher than 25 kHz.

40 Claims, 12 Drawing Sheets

POWER MODULE

CROSS REFERENCE TO RELATED APPLICATIONS

This Non-provisional application claims priority under 35 U.S.C. §119(a) on Patent Application No(s). 201010230158.X filed in People's Republic of China on Jul. 15, 2010, the entire contents of which are hereby incorporated by reference.

BACKGROUND OF THE INVENTION

1. Field of Invention

The invention relates to a power module, and more particularly to a power module applied to a power converter.

2. Related Art

High efficiency and high power density are always the requirements on the power converter. The high efficiency represents that the energy consumption is decreased, and is advantageous to the energy saving, heat reduction, and environment protection, and the spent cost can be reduced. The high power density represents the small size and the light weight, and can decrease the transportation cost and the required space so that the building cost can be reduced. The high power density also represents the reduction of the used materials, and is further advantageous to the energy saving, heat reduction, and environment protection. Therefore, the seeking on the high efficiency and the power density in the power field becomes unceasing.

There are more kinds of power converters due to different applications of the power converters. The power converters may be classified into a non-isolated AC/DC power converter, a non-isolated DC/DC power converter, an isolated DC/DC converter, an isolated AC/DC power converter and DC/AC, AC/AC power converters according to the type of the electric energy being converted. The non-isolated AC/DC power converter is, for example, composed of an AC/DC conversion circuit for a power factor correction (hereinafter referred to as PFC) circuit. The isolated AC/DC power converter is composed of one PFC circuit and one or multiple DC/DC converters. Because the electric energy properties to be converted and the conversion levels are different, the power densities and efficiencies, which can be easily achieved by various converters, are not always the same. Taking the isolated AC/DC power converter as an example, the general industrial power density is 10 W/inch$^3$, and the efficiency is about 90%. The non-isolated AC/DC power converter, the isolated DC/DC converter and the DC/AC power converter have the higher efficiencies and power densities.

As mentioned above, the high efficiency of the power converter represents the low energy consumption. If the efficiency is 90%, the converted energy consumption is equal to about 10% of the total input energy of the power converter. If the power converter has the efficiency of 91%, its converted energy consumption is reduced to 9% of the total input energy. That is, when the efficiency is increased by one point, the energy consumption is reduced by 10% as compared with the power converter with the efficiency of 90%, and the improvement is very considerable. In fact, the efforts on the efficiency improvement of the power converter are often proceeded with the order of magnitude equal to 0.5% or even 0.1%.

The energy consumption of the power converter is mainly composed of the on-state loss and the switch loss, especially the switch loss of the active device. The switch loss is more significantly affected by the working frequency. The power converter, especially the switch power converter, has the working frequency usually higher than 20 kHz in order to decrease the audio noise. The selection of the actual working frequency of the power converter is more significantly affected by the inactive device, especially the magnetic element. If the magnetic element has the small size, the high frequency is usually needed to decrease the magnetic flux density of the working element in order to achieve the reliable work. Thus, the high switch loss is induced. Alternatively, the wire diameter of the wire set and the number of loops in the magnetic element can be increased so that the on-state loss is increased and the high loss is further induced. On the contrary, if the magnetic element has the large size, the working frequency can be lowered under the precondition of assuring the reliable work, and the switch loss is thus decreased. Also, the wire diameter of the wire set and the number of loops in the magnetic element may be decreased, so that the on-state loss is decreased, the total loss is decreased and the high efficiency is obtained.

Therefore, it is easy to understand that one of the key factors of obtaining the high power density or the high efficiency is to enhance the space availability inside the power converter. As the space availability gets higher, the larger space for the inactive device, especially the magnetic element, which is very important to the power converting efficiency, is left. Thus, the large-size inactive element can be easily used so that the power efficiency is increased. Also, the total power of the power source can be increased by using the large-size inactive device, so that the power density of the power converter can be enhanced. Thus, for the high power space availability, the high efficiency can be achieved more easily under the specific power density, or the high power density can be achieved more easily under the specific efficiency, and it is possible to possess both the high power density and the high efficiency concurrently.

The semiconductor chip is one of the important factors of determining the efficiency of the power converter. However, the semiconductor chip usually unavoidably needs to use additional materials, such as the package material for protecting the semiconductor, the heat sink for dissipating heat, the fixture for fixing the semiconductor chip, and the like, which are useless to the electricity converting efficiency. The internal spatial availability of the power source becomes worse as the ratio of these materials to the power converter gets larger. Thus, the power semiconductor chip and the spatial volume occupied by the power chip are getting more and more emphasized.

In the integrated power module (IPM), many semiconductor chips are integrated in one chip package so that the spatial availability in the package may be enhanced. However, the space occupied by the power chip in the existing power module cannot be effectively decreased, and the existing power module is seldom used in the high-performance power converter.

In order to enhance the power density or converting efficiency of the power converter, a reasonable solution to the power module with the high space availability and the reasonable cost is required. The existing arts, however, cannot easily satisfy these conditions.

SUMMARY OF THE INVENTION

In view of the foregoing, an objective of the invention is to provide a power module suitable for a power converter to enhance the power density or efficiency, and provides an implementation of the power module supporting the solution.

To achieve the above objective, the invention discloses a power module including a first power chip and a second power chip, each of which is molded in the same molding material and has at least two electrodes. At least one of the power chips has at least three electrodes, and at least one of the power chips operates at a frequency higher than or equal to 25 kHz. The power module is applied to a power converter. An operation voltage of at least one of the power chips in the power converter is higher than 48 volts. The power converter has a power density and a maximum efficiency respectively higher than 15 W/inch$^3$ and 92%, or has the power density higher than 20 W/inch$^3$ or the maximum efficiency of the power converter higher than 93%. A total volume ratio of the power module to the power converter is smaller than 50%. A ratio of an electric energy converting stage processing power of the power converter using the power module to a total output power of the power converter is higher than or equal to 30%, and the total output power of the power converter is higher than or equal to 150 W.

The power converter is, for example, an AC/DC power converter, an isolated DC/DC converter or a DC/AC converter. The power converter has the power density and the maximum efficiency respectively higher than 20 W/inch$^3$ and higher than 93%, or the power density higher than 25 W/inch$^3$, or the maximum efficiency higher than 94%.

In one embodiment, the power module further includes a first heat sink, a thermo-conductive insulating layer, a lead frame and a molding material. The first power chip and the second power chip are disposed above the first heat sink. The first heat sink has a first area and a second area, and the first power chip is disposed in the first area. The thermo-conductive insulating layer is disposed in the second area and has an insulating layer. The second power chip is disposed above the first heat sink through the thermo-conductive insulating layer. The lead frame is electrically connected to at least one of the first power chip and the second power chip. The molding material covers the first power chip, the thermo-conductive insulating layer, the second power chip and one portion of the lead frame.

In one embodiment, the power module further includes a third power chip, a fourth power chip, a lead frame and a molding material. The third power chip is disposed above the second power chip, and the fourth power chip is disposed above the first power chip. The lead frame is disposed between the first power chip and the fourth power chip, disposed between the second power chip and the third power chip, and disposed above the third power chip and the fourth power chip. The molding material covers the power chips and at least one portion of the lead frame.

As mentioned hereinabove, a plurality of power chips is integrated in the power module of the invention, so that the power density or efficiency can be significantly enhanced. For example, the power converter using the power module has the power density and the maximum efficiency respectively higher than 15 W/inch$^3$ and higher than 92%, or the power density higher than 20 W/inch$^3$, or the maximum efficiency higher than 93%. The power converter may be an AC/DC power converter, an isolated DC/DC converter or a DC/AC converter. The power converter may have the power density and the maximum efficiency respectively higher than 20 W/inch$^3$ and higher than 93%, or the power density higher than 25 W/inch$^3$, or the maximum efficiency higher than 94%. At least one of the power chips operates at a frequency higher than or equal to 25 kHz. The power module serves as one element applied to the power converter. The total volume ratio of the power module to the power converter is smaller than 50%. The power module serves as a power element applied to the power converter, and the ratio of the electric energy converting stage processing power of the power converter using the power module to the total output power of the power converter is greater than or equal to 30%, while the total output power of the power converter is higher than or equal to 150 W. In order to enhance the spatial availability and to make the power module be applied to the more complicated system, the operation voltage of at least one power chip in the power converter, such as an AC/DC power converter, an isolated DC/DC converter or a DC/AC converter, is usually higher than 48 volts. If the power converter is the AC/DC power converter, then the operation voltage of the at least one power chip in the power converter is usually higher than 200 volts.

In addition, the first power chip of the invention is not disposed above the heat sink through the thermo-conductive insulating layer, so the cost of the thermo-conductive insulating layer can be decreased. In addition, with the package method and structure of the invention for enhancing the power density or efficiency of the power converter, the higher thermal performance, electric performance, economic performance, EMC performance and reliability than those of the existing art can be obtained. The internal spatial availability is very high, and the product can be easily used and is very advantageous to the enhancement of the power density or efficiency of the converter. The embodied power module of the invention is very practical and effective. So, the invention is very suitable for the enhancement of the overall performance and the cost effectiveness of the power converter.

In addition, stacking a plurality of power chips together can decrease the connection wires, the on-state loss, the high-frequency impedance and the switch loss, and can further enhance the power performance. After the bridge circuits, including the half-bridge, full-bridge, three-phase bridge circuits, are stacked together, the portions of insulating materials that are originally used need not to be used, so that the cost can be saved, the spatial availability can be enhanced, and the performance of the power converter can be further enhanced.

BRIEF DESCRIPTION OF THE DRAWINGS

The present invention will become more fully understood from the subsequent detailed description and accompanying drawings, which are given by way of illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
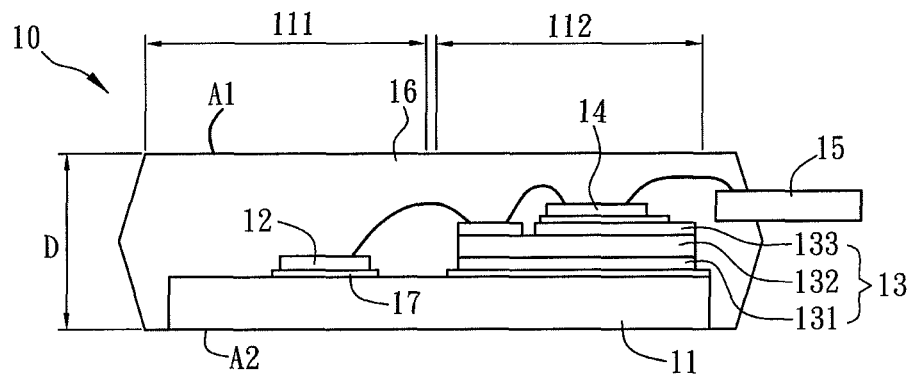
FIG. 1 is a schematic illustration showing a power module according to a preferred embodiment of the invention.

Referring to FIG. 1, a power module 10 according to a preferred embodiment of the invention may be applied to, for example, a power converter or any other device requiring power conversion. The power converter using the power module 10 has a power density and a maximum efficiency respectively higher than 15 W/inch$^3$ and higher than 92%, or the power density higher than 20 W/inch$^3$, or the maximum efficiency higher than 93%. The power converter may be an AC/DC power converter, an isolated DC/DC converter or a DC/AC converter. The power converter has the power density and the maximum efficiency respectively higher than 20 W/inch$^3$ and higher than 93%, or the power density higher than 25 W/inch$^3$, or the maximum efficiency higher than 94%. In addition, the power converter may also be an AC/AC converter. If the power converter is applied to the AC/DC power converter, the power module 10 may be applied to the power factor correction (PFC) portion, the DC/DC primary side portion (hereinafter referred to as D2D_Pri) or the DC/DC secondary side portion (hereinafter referred to as D2D_Sec) of the power converter. The total volume ratio of the power module 10 to the power converter is smaller than 50%. A ratio of the electric energy converting stage processing power of the power converter using the power module to the total output power of the power converter is greater than or equal to 30%. The total output power of the power converter is higher than or equal to 150 W. The operation voltage of at least one power chip in the power converter is higher than 48 volts.

The power module 10 is a package body and includes a plurality of power chips, such as a first power chip 12 and a second power chip 14, at least one of which operates at a frequency higher than or equal to 25 kHz to enhance the power conversion efficiency. The preferred aspect of the embodiment of the power module 10 will be described in the following. The power module 10 includes a first heat sink 11, a thermo-conductive insulating layer 13, a lead frame 15 and a molding material 16. The first heat sink 11 is disposed on a bottom side of the package body and has a first area 111 and a second area 112. The first power chip 12 and the second power chip 14 are disposed above the first heat sink 11, the first power chip 12 is disposed in the first area 111, and the thermo-conductive insulating layer 13 is disposed in the second area 112. The second power chip 14 is disposed on the thermo-conductive insulating layer 13 and electrically connected to the lead frame 15. The molding material 16 covers the first power chip 12, the thermo-conductive insulating layer 13, the second power chip 14 and at least one portion of the lead frame 15, and constitutes a main exterior of the package body. The first power chip 12 and the second power chip 14 are molded in the same molding material 16. The operation voltage of the first power chip 12, the second power chip 14 and/or the at least one power chip in the power converter is higher than 48 volts.

The first heat sink 11 may be an independent member or may be integrally formed with the lead frame 15, and may be made of a good conductor, such as copper, for electricity and heat. Herein, the heat sink 11 serves as the carrier for the first power chip 12. The first heat sink 11 may be entirely disposed inside the molding material 16, partially outside the molding material 16 or completely outside the molding material 16. In addition, the thickness of the first heat sink 11 may be greater than the thickness of the power module 10 by 20% and smaller than 3 mm. After the good heat transfer is ensured, the heat is transferred from the power chip to the heat sink, and then to various directions transversally from the heat sink so that the thermal uniformity in all directions may be implemented. Thus, the heat sink needs to have a predetermined thickness to support the transversal transfer function. In this proposed invention, the thickness of the heat sink is preferably greater than the thickness T of the power module by 20%. Taking the heat sink made of a good thermal conductor, such as copper, as an example, its coefficient of heat conductivity may reach 400 W/m·K. If its thickness occupies 20% of the overall thickness, it represents that the average ability of the transversal heat transfer of the heat sink in the zone of the overall power module is greater than or equal to 400 W/m·K× 20%=80 W/m·K, and the thickness is more advantageous to the transversal heat transfer. The transversal thermo-conductive ability gets better as the ratio gets higher, and the thermal uniformity can be implemented more easily. The higher ratio also represents the lower ratio of the molding material other than the good conductor. The thin thickness tends to transfer the heat from the heat sink to the surface of the power module more easily so that the heat exchange with the surface fluid can be performed more easily. That is, under the precondition of the fixed width of the heat sink, the thicker thickness tends to cause the large cross-sectional area more easily, the ratio of the heat sink to the overall product becomes higher, and the heat transfer ability becomes stronger. In practice, however, the thickness of the heat sink has to counterbalance with the thickness of the overall product and the factor, such as the cost. Taking the total thickness smaller than 6 mm as an example, the thickness of the heat sink is preferably not greater than 3 mm. Based on this, the ratio of the thickness of the heat sink to the overall thickness of the power module is preferably greater than or equal to 20%. This is more advantageous to the implementation of the two-side heat dissipating property.

The first power chip or the second power chip has at least two electrodes. At least one of the power chips has at least three electrodes. For example, the first power chip 12 and/or the second power chip 14 have/has at least three electrodes. The power chip is, for example, a metal oxide semiconductor field effect transistor (MOSFET) chip. One MOSFET chip usually has two opposite parallel surfaces, including an upper surface and a lower surface. Two electrodes, including a source and a gate, are usually disposed on the upper surface, while a drain is disposed on the lower surface to serve as the electrode. The lower surface may be directly assembled with the heat sink 11 using a bonding material layer 17, which may include a strap bonding solder, an electroconductive silver paste, a sintering metal material or the like.

Such a bonding material has the higher coefficient of heat conductivity, which is typically not lower than 2 W/m·K, and the thickness of the layer may be controlled to be thinner (e.g., smaller than 200 microns usually smaller than 100 microns). Thus, the thermal conductivity between the power chip 12 and the heat sink 11 may be controlled to be lower. For example, the bonding material layer 17 has the thermal conductivity of 20 W/m·K, the thickness of 100 microns, the area of 10 mm by 10 mm, and the thermal resistance of 0.05 K/W. The thermal conductivity of the first heat sink 11 itself is usually very low, so that the thermal resistance (Rjc) from the junction of the chips to the housing of the first heat sink 11 is very low. The first heat sink 11 usually has the higher heat capacity, so the performance of the power chip against the thermal shock is very excellent. To sum up, the first power chip 12 directly mounted on the first heat sink 11 has the very excellent thermal performance. Because of the presence of the first heat sink 11, the heat of the power module 10 becomes more uniform, which is more advantageous to the heat management. Of course, only the power chip is described as an example herein.

The package type of this embodiment is used inside the power source. In order to achieve the higher spatial availability and enhance the performance of the power module 10, the module surface needs not to be completely insulated from the internal circuit so that the insulation cost, the space wastage caused by insulation, and the effect of the attenuated heat dissipating ability can be decreased. In some specific occasions, the first heat sink 11 may be directly utilized to serve as the electroconductive channel. Because the first heat sink 11 is usually made of the good electro-conductor, such as copper and aluminum, and has the relatively thick thickness, which is usually not smaller than 0.5 mm, the electroconductive performance thereof is extremely excellent. Thus, the better electric performance can be obtained, the generated heat can be reduced, and the thermal performance of the package body can be further improved. Furthermore, the first heat sink 11 may directly serve as a pin, or may be connected to at least one pin. That is, the pin may be integrally formed with the first heat sink 11, or the pin may be electrically connected to the first heat sink 11 by way of wire bonding, welding, strap bonding, adhering using a conductive adhesive, and the good electro-conductor of the surface can be sufficiently utilized. This can greatly decrease the thermal resistance from the chip to the first heat sink 11, and enable thermal and electric abilities of the good electro-conductor of the first heat sink 11 to be simultaneously discovered. Thus, the spatial availability is enhanced, and the power density or converting efficiency of the power converter can be advantageously enhanced.

Figure 21:
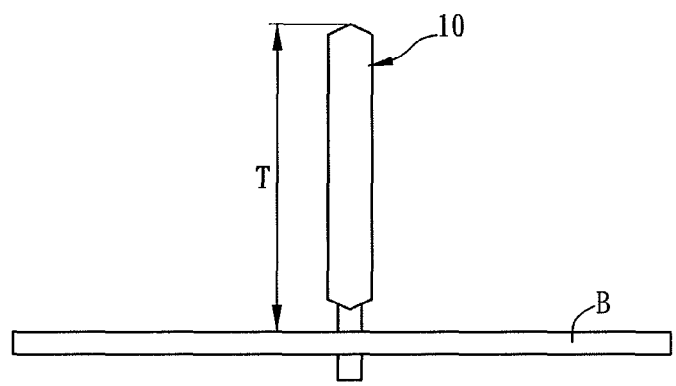

In addition, the thickness D of the power module 10 may be smaller than or equal to 6 mm. Due to the present requirement on the power source, the power source is to be designed as thin as possible. The trend of the future power source is equal to one industry unit thickness (1U), which is about 44.45 mm thick. As shown in FIG. 21, the power module 10 is mounted upright on a printed circuit board (PCB) B having a highest point, wherein the height T from the highest point to the surface of the printed circuit board B is smaller than or equal to 35 mm. Meanwhile, in order to utilize the internal space of the power source sufficiently, the height of the power module cannot be too small, and is preferably greater than 60% of the height of the highest point. For example, the distance from the highest point of the power module 10 to the upper surface of the circuit board B is preferably higher than 35 mm×60%=21 mm. In this embodiment, the pin of the power module 10 projects beyond the bottom of the power module 10 and stands upright on the circuit board B, and the power module 10 is a direct insert type package (e.g., SIP or DIP).

Figure 22:
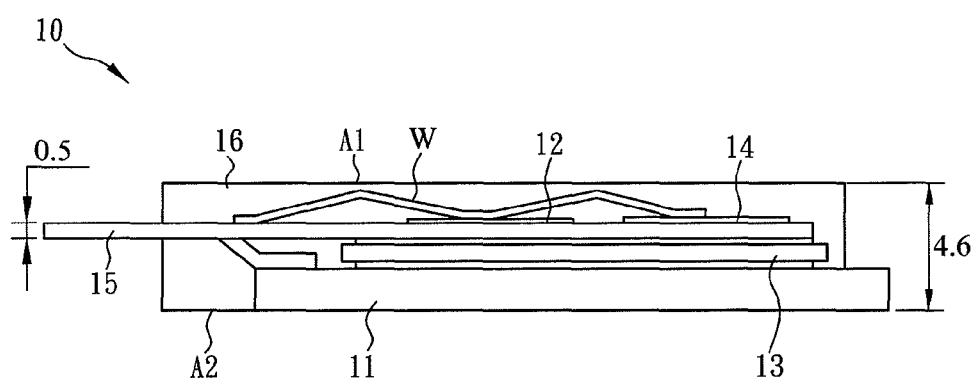

In addition, FIG. 22 is a cross-sectional view showing dimensions of an application example of the power module 10 of the invention. The thickness of the heat sink 11 preferably occupies more than 20% of the total thickness of the power module 10. For example, the adopted thickness of the heat sink 11 (Cu) is 1.5 mm, and occupies about 32.6% (higher than the desired 20%) of the total thickness, so that the better thermal uniformity is obtained. The designed distance from the front surface A1 of the molding material 16 to the highest point of the bonding wire W is 0.24 mm, which is smaller than the desired 0.5 mm so that the better ability of transferring energy from the power chips (dies) 12, 14 to the front surface of the molding material 16 is obtained. The distance from the molding material 16 to the thinnest portion of the upper surface of the power chip is 1.24 mm (i.e., the distance from the front surface A1 of the molding material to the upper surface of the power chip 12 or 14), and the actual average thickness is smaller than or equal to 2.5 mm to satisfy the expectation smaller than 3 mm, to satisfy the expectation smaller than 55% of the total thickness, and to satisfy the requirement of the expected 60%. The embodiment has the good two-side heat dissipating ability and the stronger self heat dissipating ability, does not need the threaded holes for mounting, and has the higher spatial availability. In FIG. 22, the power module 10 has the total thickness of 4.6 mm, and is successively composed of 0.24 mm (the thickness from the front surface A1 to the highest point of the wire W), 1.0 mm (the height of the wire W), 0.175 mm (the thicknesses of the chips 12, 14), 0.05 mm (the thickness of solder), 0.5 mm (the thickness of the lead frame 15), 0.05 mm (the thickness of the solder), 1.03 mm (the thickness of the thermo-conductive insulating layer 13), 0.05 mm (the thickness of solder) and 1.5 mm (the thickness of the heat sink 11).

In the experiment of outputting the communication power source with 2700 W and AC/DC 48V, the volume improvement of this embodiment is very obvious as compared with the existing art, so the DC/DC stage magnetic element is changed from the original smaller PQ32/30 to the PQ35/35, the operation frequency is decreased from the original 100 kHz to 65 kHz, and the efficiency is increased by more than 0.5%. Similarly, the PFC stage magnetic element is changed from the original PQ35/35 to PQ40/40, so that the operation frequency is decreased from the original 70 kHz to the 45 kHz, and the efficiency is increased by more than 0.3%. Due to the frequency decrease, the driving loss is significantly decreased. Due to the efficiency increase, the work consumption of the fan may also be decreased, thereby significantly decreasing the power loss and increasing the efficiency by about 0.2%. Because many chips are integrated in the power module, the paths thereof may be optimized, and the DC impedance and the AC impedance are decreased, so that the direct contribution to the efficiency may also reach 0.1%. Therefore, the actually total efficiency is increased by about 1%, which is very significant. These are mainly brought by the significantly enhanced spatial availability in the embodiment of the power module.

As mentioned hereinabove, the power module is particularly suitable for the high performance power converter. The power converter has the power density and the maximum efficiency respectively higher than 25 W/inch$^3$ and higher than 95%, or the power density higher than 30 W/inch$^3$, or the maximum efficiency higher than 96%.

Figure 2:
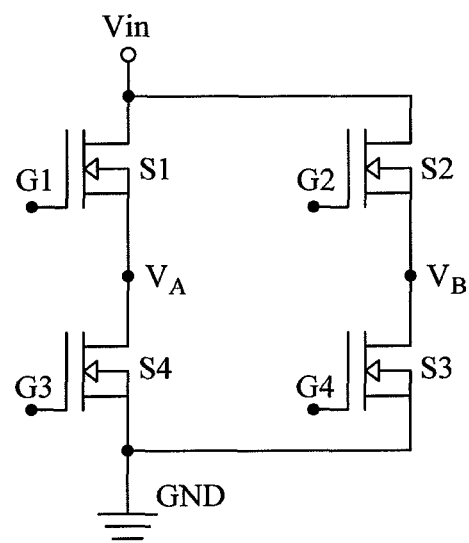
FIGS. 2 and 9 show different aspects of a full-bridge circuit applied to the power module according to the preferred embodiment of the invention.

The full-bridge circuit is frequently used in the occasion, such as the primary side or secondary side of the transformer. So, the power module 10 of this embodiment may be applied to the full-bridge circuit. FIG. 2 is a schematic illustration of the full-bridge circuit. To satisfy the application, the power module 10 at least has to accommodate eight function pins Vin, GND, VA, VB, G1, G2, G3 and G4. In the typical application, the voltage at each of the pins Vin, GND, VA and VB can reach 400 volts, and the insulation distance between the pins ranges from 2 to 3 mm. The voltages between G1 and VA, G2 and VB, G3 and GND, G4 and GND are lower than 30 volts, and the insulation distance between the pins ranges from 0.5 to 1 mm. The width of the pin may be designed to range between 0.5 and 2 mm. In some occasions, chips, such as temperature sensors, have to be integrated, so at least two pins have to be left. Thus, the package width of the power module is preferably lower than 6 cm.

In order to enhance the performance of the power module 10 and sufficiently discover the potential, the power module 10 preferably has the two-side heat dissipating ability, which is defined in the following. A uniform and constant-speed air fluid is accommodated within a sufficiently large space, and no additional heat sink is mounted on the two surfaces of the power module. The power module is placed in the sufficiently large space and directly faces the air with two surfaces in parallel with the air fluid. The difference between the heat dissipating abilities of the two surfaces does not exceed one time of the lower heat dissipating ability. That is, the heat dissipating ability of any surface is preferably not lower than ⅓ of the sum of those of the two other surfaces.

In this embodiment, the power module has two maximum main surfaces including the front surface (molding material 16) A1 and the rear surface (the heat sink 11 and the molding material 16) A2, which can dissipate the heat. For example, in a heat dissipating environment with a balanced and parallel wind speed of 5 m/s, a maximum temperature difference between points in at least 80% of areas of the front surface A1 and the rear surface A2 of the power module 10 is smaller than 20% of an average temperature rise between the working environment and the front and rear surfaces. This can significantly increase the effective heat dissipating ability, and the heat can be self-dissipated in the low-loss occasion without the additional heat sink, so that the internal spatial availability of the power source can be significantly enhanced. In order to implement the better heat dissipating property, the thickness of the molding material is preferably as thin as possible. For example, the minimum gap for the bonding electroconductive material between the upper surface of the molding material 16 and the upper surface of the chip is preferably controlled to be smaller than or equal to 0.5 mm. In addition, the average thickness of the molding material 16 is smaller than 60% of the thickness of the power module 10, and smaller than 3 mm. Herein, the average thickness of the molding material 16 is defined as follows. As shown in FIG. 1, the average thickness of the molding material 16 of the power module is equal to the total volume of all the molding material of the power module divided by the main area formed by the height D of the main body and the width (not shown) of the main body.

In order to facilitate the implementation of the two-side heat dissipation, the power module is preferably applied to the power converter using the mounting method shown in FIG. 21. That is, the power module is a direct insert type package, such as a single in-line package (SIP) or a dual in-line package (DIP) to facilitate the heat exchange between the two main surfaces and the environment, so that the two-side heat dissipating effect can be achieved more easily.

In the state where the air flowing speed and the air flowing temperature have been set in advance, the average surface temperature determines the surface heat-exchange ability. The average temperature is defined as follows. The surface is divided into several micro equal parts, the products of the areas of the micro equal parts and the temperatures thereof are summated (i.e., the integration of the surface temperatures). The average surface temperature is obtained by dividing the summated sum by the total surface area. The higher the average temperature is, the more the dissipated heat is. When the heat to be dissipated is predetermined, it represents that the average surface temperature must fall within a predetermined range. At this time, if the surface heat distribution is hoped to be as uniform as possible, it represents that the highest temperature point is lower, so that the lower power chip node temperature can be obtained more advantageously, the chip can operate reliably, and the better performance may be obtained.

In addition, the average temperature rise of the surface area is defined as follows. The surface-area average temperature is obtained according to the definition of the average surface temperature. The average fluid temperature of the area is obtained by dividing the sum of the fluid temperature entering the area and the fluid temperature leaving the surface by 2. The surface-area average temperature minus the average fluid temperature of the area is the average temperature rise of the surface area.

In order to reduce the mechanical stress in use so that the module can be designed to be thinner more easily, the power module may also be free of a predetermined screw mounting hole to further enhance the spatial availability. If the additional heat sink has to be mounted, the screw-free solution, such as direct adhering or the like, can be selected.

Therefore, the power module 10 of this embodiment significantly enhances the amounts of this type of packages, is very suitable for the current and future requirements of the power converters, can enhance the spatial availability of the power converter, and can thus enhance the power density or the efficiency of the power source.

In addition, referring again to FIG. 1, the second power chip 14 is disposed above the heat sink 11 through the thermo-conductive insulating layer 13, and is not directly placed on the heat sink 11. The thermo-conductive insulating layer 13 may have an insulating layer 132, such as a ceramic sheet for insulation. In order to ensure the heat dissipating ability, the thermo-conductive insulating layer 13 has the thermal resistances, which should be smaller than 3 K/W, above and below the 10×10 area. The thermo-conductive insulating layer 13 is, for example, a metal substrate or metalized ceramic substrate, such as a direct bonded copper (DBC) ceramic substrate, a thick copper circuit layer mounted on a metalized ceramic sheet, a direct bonded aluminum (DBA) ceramic substrate, an aluminum substrate, a copper substrate, or a highly thermo-conductive substrate with the other type. Herein, the thermo-conductive insulating layer 13 is the DBC substrate, for example. The thermo-conductive insulating layer 13 may include a thermo-conductive layer 131, an insulating layer 132 and a trace layer 133, wherein the thermo-conductive layer 131 and the trace layer 133 may be made of copper, while the insulating layer 132 may be made of a ceramic material.

Taking the frequently used DBC substrate as an example and comparing with the prior art, the invention may have only a portion of chips (second power chip 14) mounted on the thermo-conductive insulating layer 13. Because the chips mounted thereon are decreased, the DBC substrate area may also be correspondingly reduced, so that the material cost of packaging can be decreased, and the economic performance of packaging can be increased. In addition, because the DBC substrate area is reduced, the warpage phenomenon, caused by the different coefficients of thermal expansion (CTE) of the DBC substrate, the heat sink 11 and the molding material 16 is also eased. This is because the warpage induced by the mismatch between the CTEs of different materials usually becomes serious with the increase of the dimension. Thus, the stress inside the package body can be reduced, and the reliability of the package body can be further enhanced. Because the portion of chips (first power chip 12) has been directly connected to the heat sink 11, the materials to be insulated in the power module of the invention are significantly reduced as compared with the existing art. Thus, the cost is decreased, the thermal arrangement ability is enhanced, and the difficulty of reliability design, caused by the mismatch between the CTEs of the materials, can be advantageously decreased.

In the practical application and in some occasions where the heat dissipating requirements are very harsh, the molding material 16 with the higher coefficient of heat conductivity, which is not lower than 1 W/m·K, and is preferably higher than 1.2 W/m·K or even higher than 1.8 W/m·K, may be selected. Thus, the heat dissipating ability on one side of the molding material can be enhanced, so that the excellent two-side heat dissipation can be enhanced, and the heat dissipating ability of the overall package body can be enhanced.

Figure 3:
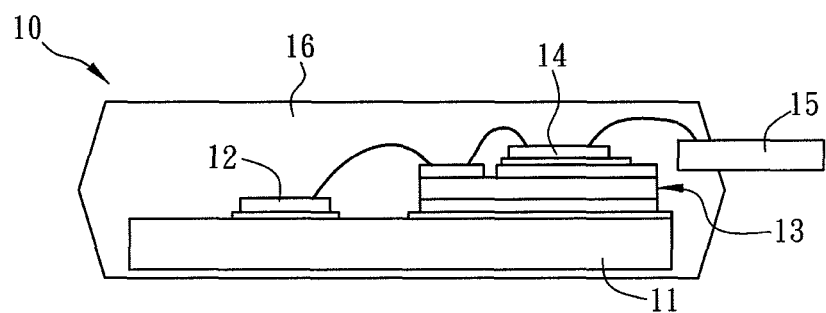
FIGS. 3 to 8, 10-16, 17A-17D and 18 to 22 are schematic illustrations showing different aspects of the power module according to the preferred embodiment of the invention.

FIG. 3 shows another extended application of the package type, wherein insulating processing may be performed on the surface of the heat sink, so that the first heat sink 11 is entirely covered by the molding material 16 and either surface thereof is not exposed to the outside, or an insulation body is provided to insulate the heat sink 11 from the outside so that it can be used in the occasion where the insulation is desired. In order to ensure the heat dissipating ability, the insulation body or the molding material 16 has the thermal resistances, which should be smaller than 3 K/W, above and below the 10 mm×10 mm area.

Figure 4:
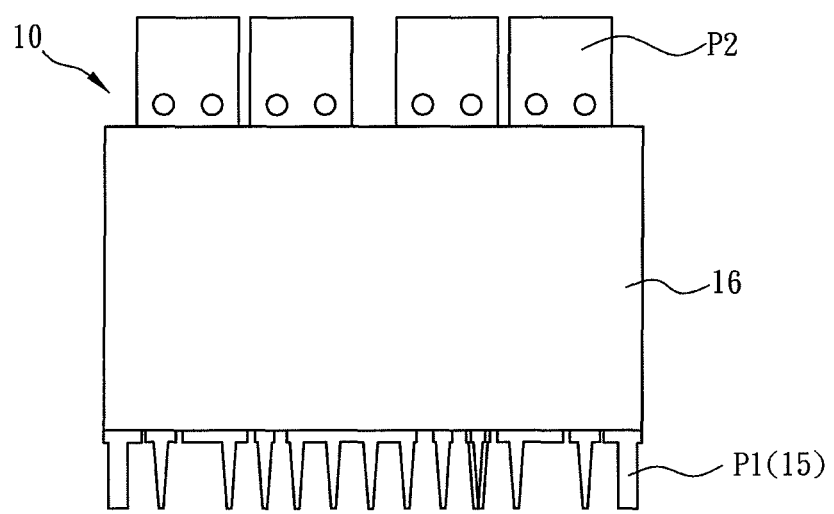

In order to make the package type of the power module be extended to more occasions, it may be designed to have two rows of pins. As shown in FIG. 4, when the internal circuits are too complicated so that more pins are needed, one row of pins P2 may be added to the features mentioned hereinabove. If this package type is applied to the occasion where one single-row of pins P1 are enough, then the upper row of pins P2 in the drawing may be designed for the use of heat dissipating. For example, the sum of heat dissipating amounts through the pins P2 is higher than or equal to 5% of the total heat dissipating amount of the power module 10. In addition, in order to ensure that it can effectively assist in the heat dissipating, the difference between the first average temperature difference between it and the environment, and the second average temperature difference between the environment and the higher one of the average temperatures of the front and rear surfaces should not exceed 50%.

As is well known in the art, the more voltage trip points in the power source cause the stronger electromagnetic radiation, and thus bring the difficulty to the electromagnetic compatibility of the power source. The heat sink 11 of the invention has the electric property and its area is relatively large, so the hidden danger is brought to the electromagnetic radiation. However, if the electric property of the heat sink 11 is optimized, it is possible to design the heat sink 11 into a mask layer of the electromagnetic radiation, and the electromagnetic compatibility is further enhanced. For example, the heat sink 11 is connected to a voltage static location. In this voltage static location, the potential is more silent and has the less noise relative to the ground. For example, the pins Vin and GND in FIG. 2 are quieter than the other voltage points. Designing the heat sink 11 into Vin or GND is more advantageous to the electromagnetic compatibility. In the actual operation, however, the surface of the power chip to be connected to the heat sink 11 needs to have only one electrode (the first power chip 12 in this embodiment) in order to facilitate the implementation. Taking the MOSFET as an example, the voltage between its drain and source is usually higher than the voltage between the gate and the source. So, the source and gate of its chip usually share one surface, and the drain thereof usually occupies one surface. Therefore, the drain serves as the power chip (first power chip 12) at the static location, and is directly connected to the heat sink 11, so that the electromagnetic compatibility can be enhanced, and the manufacturing processes become more convenient.

Figure 5:
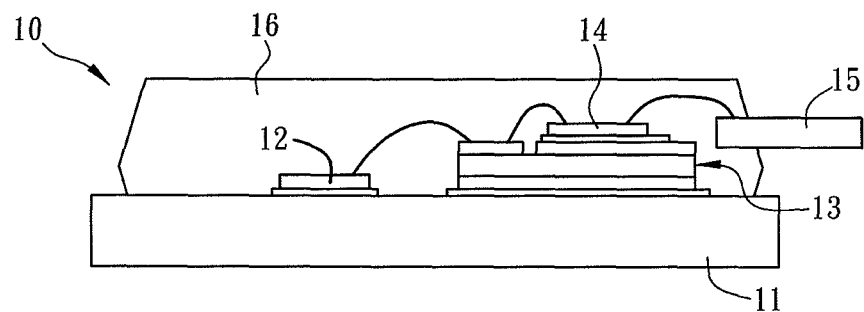

As shown in FIG. 5, the width/length of the heat sink 11 on the backside can be increased, or even the heat sink 11 can be bent so that the heat sink 11 exceeds the portion covered by the molding material 16, and the surface area is enlarged. The two surfaces of the heat sink 11 exceeding the molding material 16 can implement the heat exchange with the environment. Thus, the heat dissipating performance of the power module 10 can be further enhanced.

Figure 6:
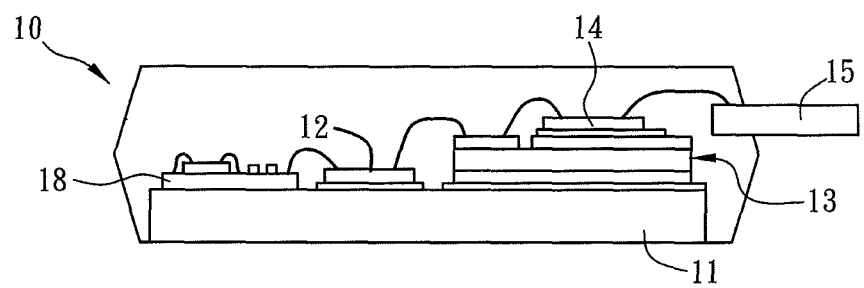

As shown in FIG. 6, in some occasions, a few power semiconductor chips have to be mounted inside the package body and a few control functions have to be integrated. The control wires are usually more complicated. Thus, the substrate, such as PCB or IC, with the higher interconnection density has to be adopted. In this aspect, a controller 18, such as a high density interconnection board, mounted with the control wires, or a control IC may also be packaged into the package body.

Figure 7:
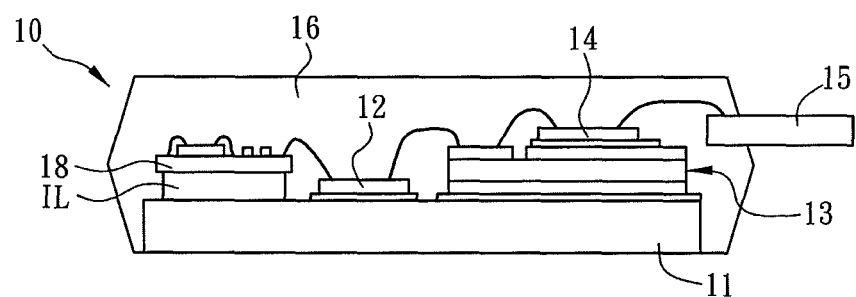

As shown in FIG. 7, the controller 18 may be a high density substrate with the lower coefficient of heat conductivity but the higher interconnection density, so that more control functions can be integrated. The controller 18 usually has the temperature resisting level lower than that of the power chip. Thus, a heat insulating layer IL, having the thermal conductivity usually lower than 0.5 W/m·K, is disposed between the controller 18 and the heat sink 11. Thus, the temperatures of the controller 18 and the chip mounted thereon can be decreased.

Figure 8:
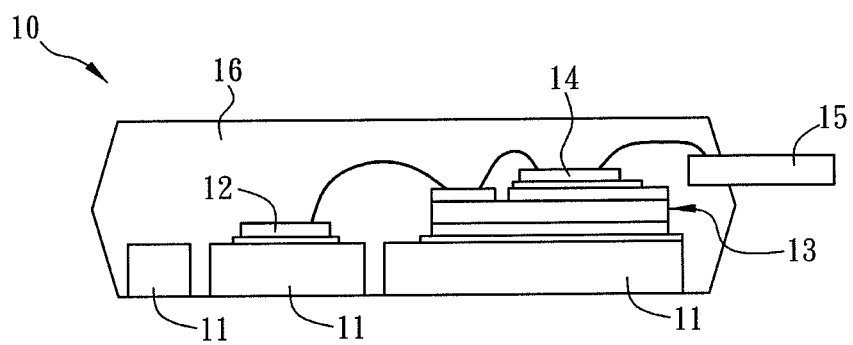

As shown in FIG. 8, the heat sink 11 is not restricted to one block, and may be further divided according to the requirement to form a few circuit patterns. That is, the heat sink 11 may also have many electrodes so that the flexibility in designing the power module can be further enhanced.

Figure 9:
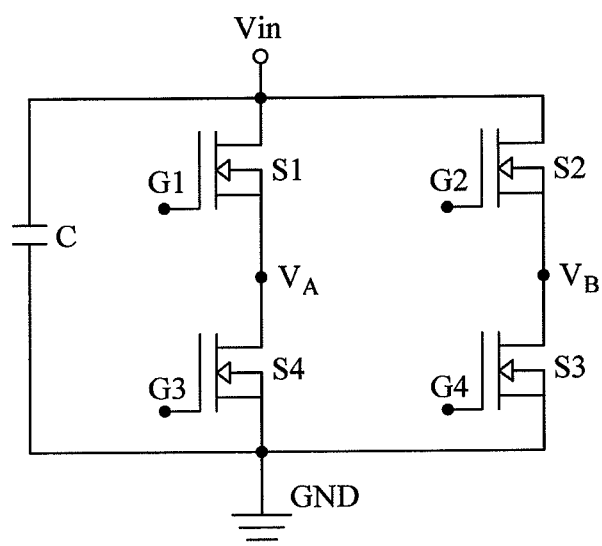

In the power module 10, many chips are integrated together. Compared with the independent chips, the current flowing loop is significantly decreased so that the loop inductor is decreased. That is, the loss and the voltage noise are decreased. However, the power module still can be continuously optimized. As shown in FIG. 9, taking the full-bridge circuit as an example, a high-frequency capacitor C is added to the inside of the power module 10 to decrease the loop and the loop inductance.

Usually, the power converter real-time monitors the temperature state of the power semiconductor for the security and reliability considerations. If the temperature is too high or the temperature rise is too fast, it represents that the circuit is in danger, and the prevention operation, such as shutting down the power or the like, can be performed in advance. The temperature detection for the independent chips can only be performed by adding temperature sensors to the outside thereof. So, the internal temperature state cannot be reflected in time, and the mounting of the temperature sensor is also more complicated. So, the temperature sensors may further be integrated in the power module to enhance the temperature monitoring effect and simplify the usage.

Figure 10:
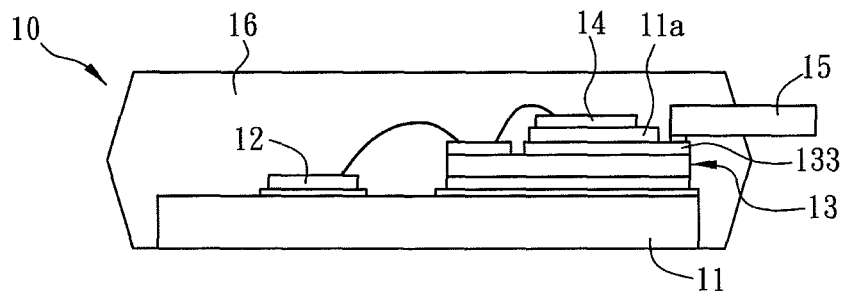

As shown in FIG. 10, this aspect of the power module further includes a second heat sink 11a, disposed between the second power chip 14 and the thermo-conductive insulating layer 13. The power chip encounters the transient impact exceeding several times of the normal working current in the working operation, for example. So, the second heat sink 11a can improve the ability of the element, mounted on the DBC substrate, against the thermal shock without enlarging the area of the thermo-conductive insulating layer 13 (DBC substrate). In addition, the lead frame 15 extends such it is connected to the trace layer 133 of the thermo-conductive insulating layer 13.

Figure 11:
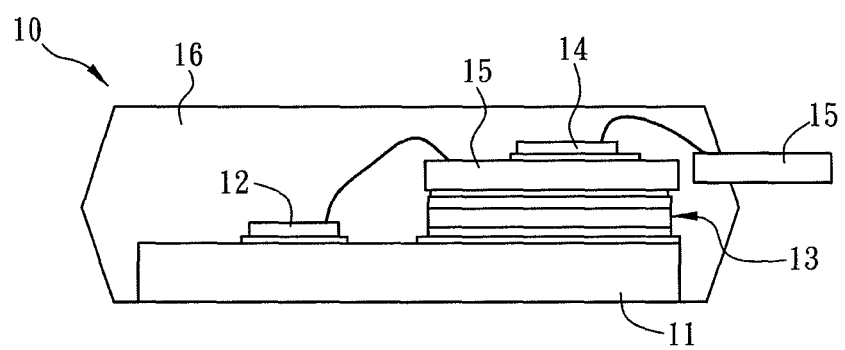
Figure 12:
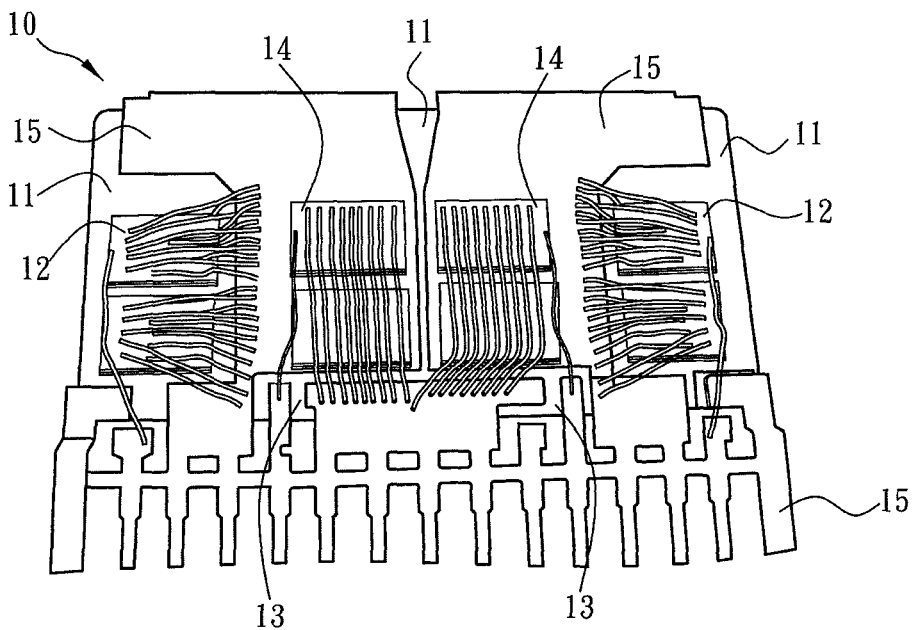

As shown in FIG. 11, in order to improve the performance of the element (e.g., the second power chip 14 generating the more heat) against the thermal shock on the thermo-conductive insulating layer 13 (e.g., the DBC substrate), and further improve the current withstanding ability of the traces on the DBC substrate (because the thickness of the copper layer on the DBC substrate is affected by the DBC forming technology and is thus not higher than 0.5 mm, and is usually not higher than 0.3 mm), the current conducting impedance is decreased, the area of the lead frame 15 can be enlarged, and the lead frame 15 is bonded to the trace layer on the DBC substrate through an electroconductive material. The photo of a physical object of one power module developed using this structure is illustrated in FIG. 12 (the object is not covered by the molding material). The thermo-conductive insulating layer 13 is bonded to the first heat sink 11 by way of strap bonding, and the lead frame 15 is similarly electrically and mechanically connected to the trace layer of the thermo-conductive insulating layer 13 by way of strap bonding. The power module 10 of FIG. 12 uses the DBC substrate having the trace layer with the thickness of 0.3 mm, and the lead frame 15 with the thickness of 0.5 mm. Thus, the conducting resistance using this structure is decreased more than 60% as compared with that of the case where the chip is directly bonded to the trace layer of the DBC substrate. Thus, the heat generated by the module can be effectively decreased, the electric performance of the module can be enhanced, and the heat dissipating performance of the module can be improved.

Figure 13:
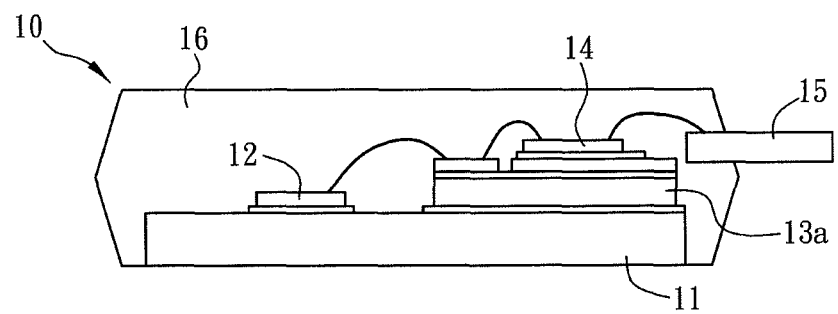

As shown in FIG. 13, in addition to the DBC substrate with the good thermo-conductive ability, another substrate, such as a copper substrate 13a, similarly having the better thermo-conductive ability may also be used in the power module 10. In the structure of the typical copper substrate, an insulating layer and a thin copper trace layer are formed on a thicker copper substrate. In addition, the numbers of the insulating layer(s) and the thin copper trace layer(s) are not restricted to one, and multiple layers may be adopted. In some occasions, the higher layout density can be implemented.

Figure 14:
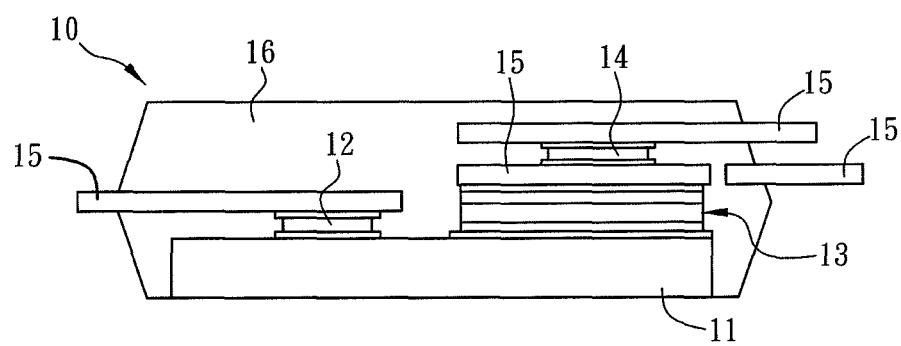

In general, signals are transmitted between the first power chip and the second power chip through wires formed by way of wire bonding. Because the wires are usually aluminum wires, the internal resistance thereof is very large. If the gold (Au) wires are adopted, the cost is too high. Although the copper (Cu) wires have been disclosed in the latest technique, the internal resistance is still very large. As shown in FIG. 14, in order to reduce the loss caused by the internal resistance of the package, the wireless bond technique may be adopted in this invention. For example, copper sheets, instead of bonding wires, may be adopted to implement the current transfer, so that the internal resistance of the package is greatly decreased, and the cost thereof will not be too high. In this aspect, the lead frame 15 is extended to be connected to at least one of the first power chip 12 and the second power chip 14 to replace the wire.

Figure 15:
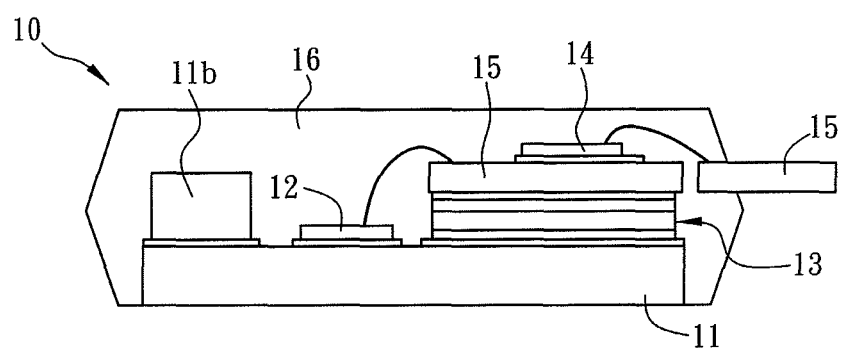
Figure 16:
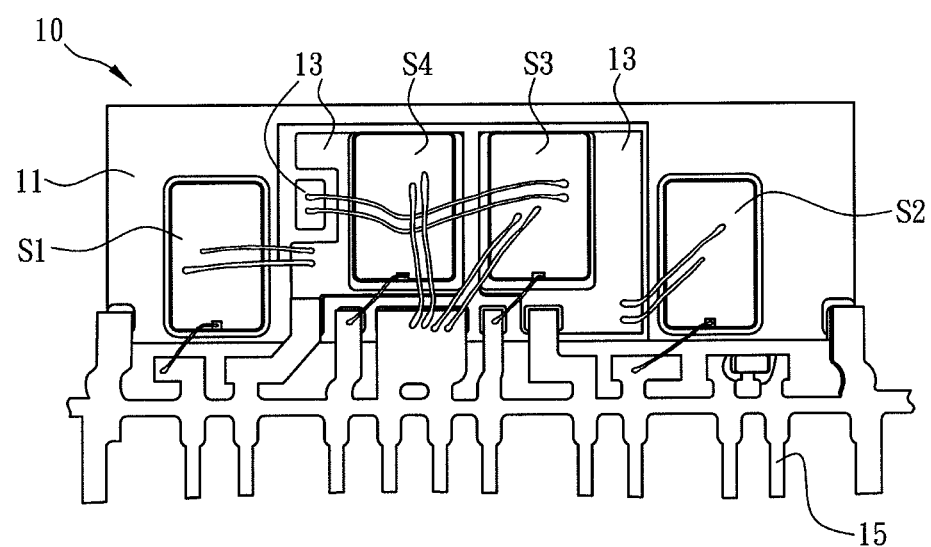

FIG. 15 shows a solution for further improving the heat transfer ability. The power module of the invention usually has some devices (e.g., the first power chip 12) directly connected to the heat sink 11 to enhance the electric performance and the thermal performance, and the insulation element (e.g., the thermo-conductive insulating layer 13 with the insulating layer) is disposed between some devices (e.g., the second power chip 14) and the heat sink 11, thereby causing the non-uniform thickness of the overall module. That is, the distance from the local molding compound 16 to the device becomes thicker so that the temperature of the molding compound 16 becomes non-uniform and the heat dissipating ability of the surface of the molding compound 16 is thus affected. In FIG. 15, a third heat sink 11b, which is the good thermo-conductor disposed in the first area of the first heat sink 11, is added to the thicker portion of the molding compound 16. The thickness from the molding compound 16 to the device is homogenized to improve the heat dissipating ability.

Figure 18:
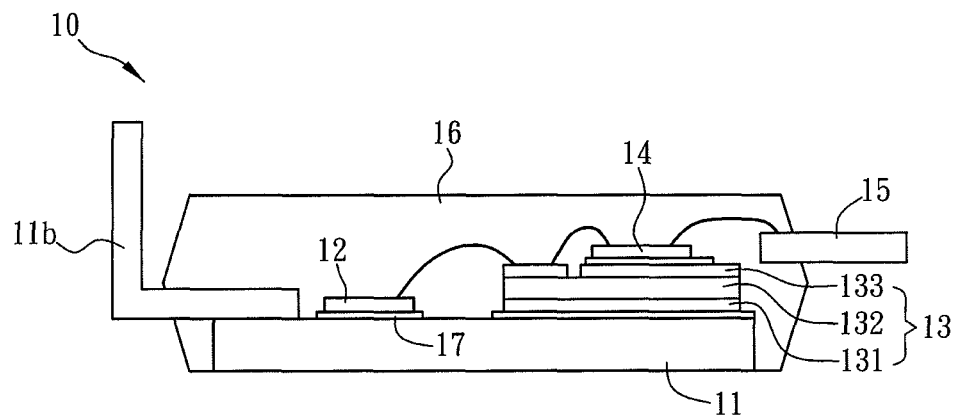

In addition, as shown in FIG. 18, the third heat sink 11b penetrates through the molding compound 16 and has a bend. The third heat sink 11b penetrating through the molding compound 16 may serve as a pin, simply dissipate the heat, or partially serve as the pin and partially dissipate the heat. The third heat sink 11b can decrease the dimension of the upright power module 10 through the bend. In addition, the total length from the package element to the apex should not be longer than 20 mm, and should be preferably not longer than 10 mm.

Figure 19:
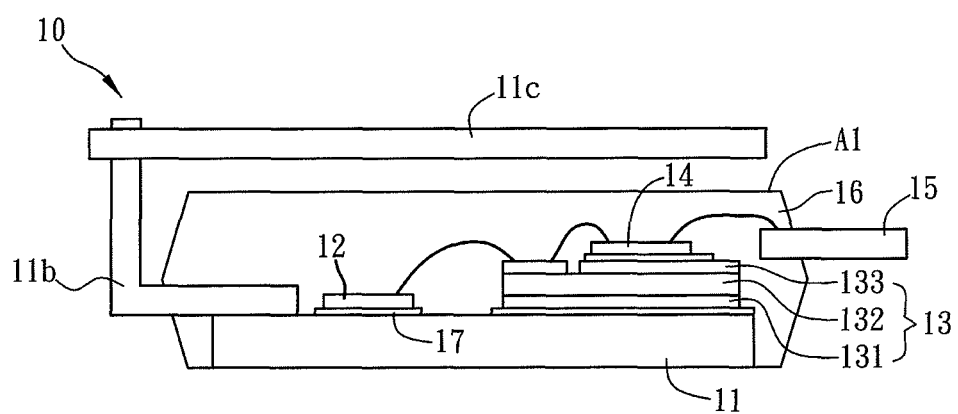

In the actual application, if the heat dissipating ability is to be further expanded, the method of FIG. 19 can be adopted. That is, a fourth heat sink 11c is further mounted on the third heat sink 11b of the power module 10. The fourth heat sink 11c may be connected to the third heat sink 11b by way of bonding, adhering or the like. Because the mounting is simple, the shape and the position of the fourth heat sink 11c are not restricted. For the actual effect, however, it is preferred to keep the heat dissipating ability on the surface of the power module 10. That is, as shown in FIG. 19, a gap is kept between the fourth heat sink 11c and the front surface A1 of the power module 10 so that the air stream may flow in the gap, and the front surface of the power module and the lower surface (near the front surface A1) of the fourth heat sink 11c can have the predetermined heat dissipating functions. In order to make the air stream flowing in the gap reach the predetermined level, the thickness of the gap may be greater than 1 mm, and preferably greater than 2 mm.

Figure 20:
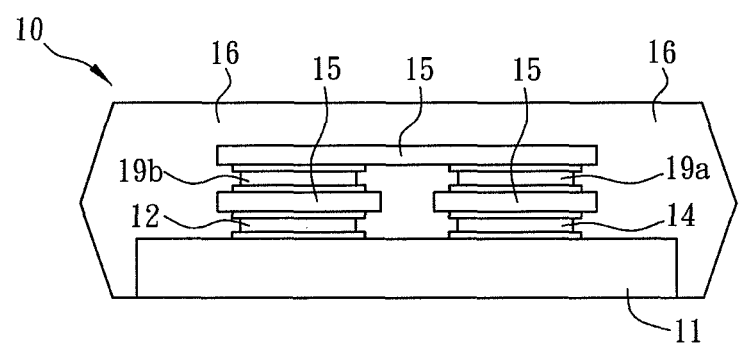

In addition, referring to FIG. 20, the power module 10 further includes a third power chip 19a, a fourth power chip 19b, a lead frame 15 and a molding material 16. The third power chip 19a is disposed above the second power chip 14, the fourth power chip 19b is disposed above the first power chip 12, and the first power chip 12 and the second power chip 14 are disposed on the heat sink 11. The lead frame 15 is disposed between the first power chip 12 and the fourth power chip 19b, disposed between the second power chip 14 and the third power chip 19a, and disposed above the third power chip 19a and the fourth power chip 19b. The molding material 16 covers the power chips 12, 14, 19a, 19b and at least one portion of the lead frame 15. Stacking a plurality of power chips together can decrease the connection wires, the on-state loss, the high-frequency impedance and the switch loss, and can further enhance the power performance. After the bridge circuits, including the half-bridge, full-bridge, three-phase bridge circuits, are stacked together, the portions of insulating materials that are originally used need not to be used, so that the cost can be saved, the spatial availability can be enhanced, and the performance of the power converter can be further enhanced.

Figure 17A:
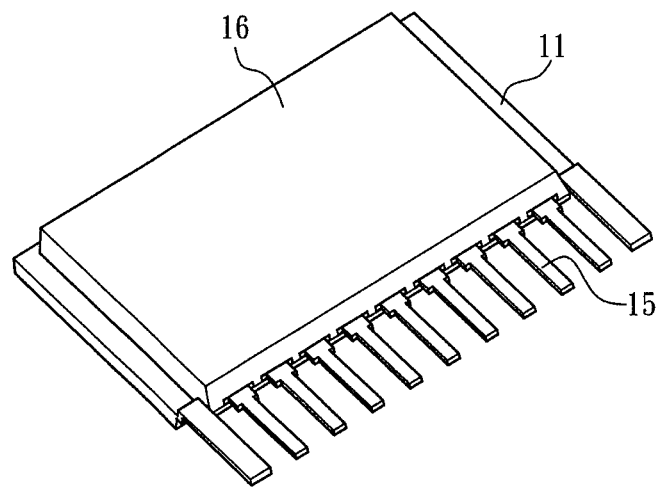
Figure 17B:
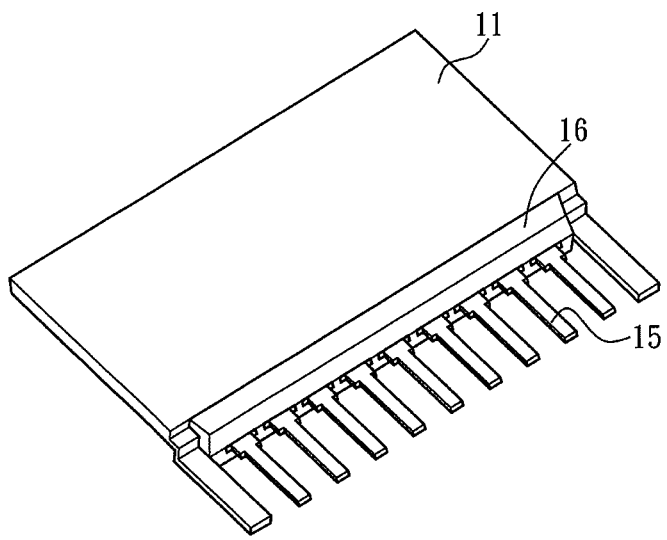
Figure 17C:
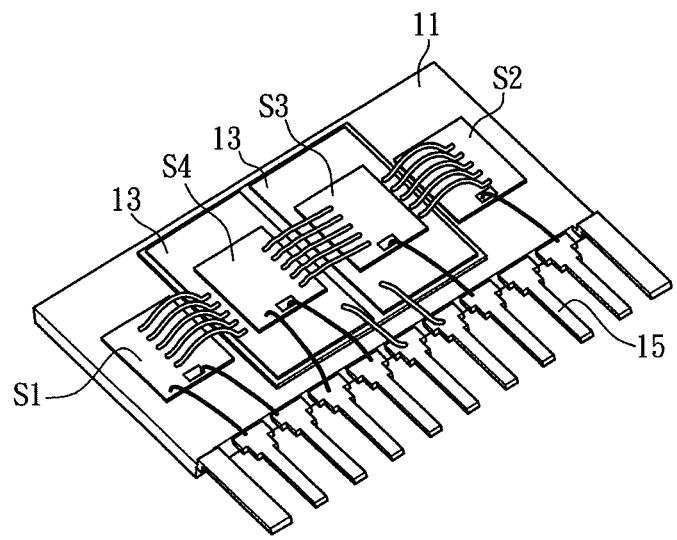
Figure 17D:
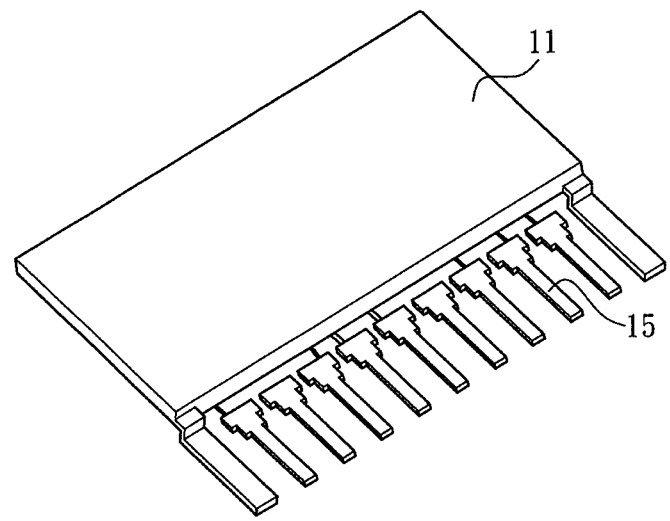

In order to explain the meanings of the invention more sufficiently, illustrations will be described with the aid of the full-bridge circuit. As mentioned hereinabove, FIG. 2 shows the topology of the full-bridge circuit, and FIGS. 16 and 17A to 17D are schematic illustrations showing the internal structure and the three-dimensional structures of the power module. FIG. 17A is a schematic front view showing the power module 10, FIG. 17B is a schematic rear view showing the power module 10, FIG. 17C is a schematic front view showing the power module 10 with the molding compound 16 being removed, and FIG. 17D is a schematic rear view showing the power module 10 with the molding compound 16 being removed.

In the above-mentioned embodiment, the first power chip 12 and the second power chip 14 are illustrated as a non-restrictive example, the first power chip 12 represents that it is disposed on the heat sink 11, and the second power chip 14 represents that it is disposed on the heat sink 11 through the thermo-conductive insulating layer 13. In the following illustrations, two first power chips S1 and S2 and two second power chips S3 and S4 will be described.

Referring to FIG. 2, the full-bridge circuit includes four switch devices S1 to S4, each of which is a MOSFET, for example. The four switch devices constitute two electroconductive bridge arms, wherein S1 and S4 constitute one bridge arm, and S2 and S3 constitute the other bridge arm. The drains of the upper switch devices S1 and S2 of the bridge arms are commonly connected to a high voltage point Vin. In the D2D application, the electric end Vin is a DC input terminal, and has a voltage waveform that is a stable DC or a DC with little ripples. The sources of the lower switch devices S3 and S4 of the bridge arms are commonly connected to the low voltage point GND. In a single bridge arm, the source of the upper switch device is connected to the drain of the lower switch device. For example, the bridge arm (S1 and S4) is connected to VA, and the bridge arm (S2 and S3) is connected to VB. The working principle is that the upper and lower switch devices of the bridge arm complementarily turn on (e.g., S1 is on while S4 is off; S1 is off while S4 is on), wherein S1 and S4 are off in a short period of time during the switch-state converting process. In the occasion of the D2D application, DC exists between the input terminals Vin-GND, while the voltage at the contact point VA/B at the middle of the bridge arm is varied between two amplitude values of 0 and Vin corresponding to the switching operations.

At present, the most typical method of extracting electrodes in the high power transistor is as follows: the drain is disposed on the backside of the chip, and the source and the gate are distributed on the front side of the chip, wherein the gate has the smaller dimension, such as 1 mm*1 mm. The strap bonding process is usually performed on the drain on the backside of the chip in advance, while the source and the gate on the front side are usually the aluminum metalized electrodes, which may be connected to the peripheral circuit by way of aluminum/gold wire bonding. The drains of the switch devices S1 and S2 are connected to the common DC potential point Vin. So, the switch devices S1 and S2 may be directly strap-bonded to the heat sink 11, while the pin of Vin electrically connected to the external device may be directly strap-bonded to the heat sink 11. Thus, the electrical conduction is achieved using the heat sink 11 with the excellent electroconductive property, thereby reducing the electricity loss and the heat generated by the package body. Thus, the best thermal and electric performance may be obtained. In the existing power module, all the four power transistors are mounted on the DBC substrate and then the electrical connections between all the power transistors and the lead frame are implemented by wire bonding according to the conventional method mentioned hereinabove. As discussed hereinabove, the advantages of the invention become obvious as compared with various defects (poor heat dissipating ability, poor electric performance, high price, poor reliability and the like) of the existing arts.

The application of the invention further has the effect of reducing the electromagnetic interference (EMI) according to the basic working principle of the full-bridge circuit. The heat sink 11 is connected to the DC input terminal Vin, which is a good static potential point, while the contact points VA and VB at the middle of the bridge arm are the voltage trip points. A large piece of heat sink 11 can effectively block the transfer of the trip signal. Thus, the interference of the trip point on the peripheral circuit can be effectively decreased, and the test EMI can be decreased.

As mentioned hereinabove, in order to possess the better EMC property and the better heat dissipating performance, the switch devices S3 and S4 in the full-bridge module are placed on the insulating layer (i.e., the insulating layer of the thermo-conductive insulating layer), and the switch devices S1 and S2 are directly placed on the heat sink 11. In order to facilitate the production and decrease the space wastage caused by the production tolerance, the switch devices S3 and S4 are placed on the insulating layers connected together. In order to decrease the loop inductance and facilitate the usage, the device S2 is disposed on the outside of the device S3, and the device S1 is disposed on the outside of the device S4. That is, for the full-bridge circuit of FIG. 2, the devices inside the module are preferably arranged in the order of S2-S3-S4-S1 or S1-S4-S3-S2 so that the performance becomes better.

In addition, the power converter of the above-mentioned embodiment may include at least two power modules, which may be molded by the same molding material to decrease the cost of the molding material.

In addition, the lead frame may also be integrated into one heat sink, which may serve as the carrier for mounting the chip. The heat sink mentioned herein is defined as the portion of the connection body covered by the package material.

The method of manufacturing the power module of this embodiment will be described in the following. In this example herein, the thermo-conductive insulating layer is a direct bonded copper ceramic substrate. In addition to a power chip (semiconductor chip), the power module is further integrated with some passive devices, such as a resistor and a capacitor, and a temperature measuring resistor is further mounted on some pins on the lead frame to provide the function of over-temperature protection for the module. The specific manufacturing processes are as follows. First, the soldering paste is applied to the position of the heat sink 11 where the thermo-conductive insulating layer 13 is to be mounted, and the position to be connected to the lead frame 15. Similarly, the soldering paste is applied to the position of the thermo-conductive insulating layer 13 where the lead frame 15 is to be assembled. Thereafter, the heat sink 11, the thermo-conductive insulating layer 13 and the lead frame 15 are placed in a jig according to the set assembling relationship. Then, the jig is placed in a reflow oven so that the heat sink 11, the thermo-conductive insulating layer 13 and the lead frame 15 can be bonded together to form an entity. In the subsequent seeding process, the lead frame 15 may be applied for transmission and positioning. After the flux cleaning, the required semiconductor devices (e.g., transistor and diode) are mounted by way of seeding. Herein, it is to be emphasized that a portion of the power chips (e.g., the first power chip 12) is placed on the heat sink 11, and the other portion of the power chips (e.g., the second power chip 14) is placed on the thermo-conductive insulating layer 13. When the seeding machine with the single function is used, surface mount technology (SMT) operations still have to be performed on some devices, such as resistors, capacitors or the like, because the seeding machine does not have the ability of grasping the SMT devices. That is, after the soldering paste is dispensed, other element devices (SMT) are placed. Because the used power chip has the larger dimension, the bonding layer formed by reflowing the soldering paste may have the higher porosity to cause the problem of the poor technology and reliability. Herein, the vacuum reflow is adopted to bond the elements to the heat sink 11, the thermo-conductive insulating layer 13 and the lead frame 15. After the flux cleaning, wire bonding processes are performed. The main process is completed after molding.

In some applications where the seeding process does not need the lead frame 15 for positioning, the technological process may be possibly simplified. First, the soldering paste is applied to required positions on the heat sink 11, the thermo-conductive insulating layer 13 and the lead frame 15. Then, the required elements (power chip and passive SMT element) are respectively disposed at the required positions. This step may be implemented by the generally powerful machine (e.g., the machine with the integrated seeding and surface mount technology functions) in one station, and may also be implemented through many machines. Thereafter, the heat sink 11, the thermo-conductive insulating layer 13 and the lead frame 15, on which the elements are placed, are placed into a jig according to the set assembling relationship to complete the assembly. Then, the vacuum reflow is performed. The subsequent techniques are the same as those in the above-mentioned processes. Thus, the number of times of reflow and the corresponding cleaning processes can be decreased. Because the number of times of reflow is decreased, the reliability of the module can be advantageously enhanced.

To sum up, with the package method and structure of the invention for enhancing the power density or efficiency of the power converter, the higher thermal performance, electric performance, economic performance, EMC performance and reliability than those of the existing art can be obtained. The internal spatial availability is very high, and the product can be easily used and is very advantageous to the enhancement of the power density or efficiency of the converter. The embodied power module of the invention is very practical and effective. So, the invention is very suitable for the enhancement of the overall performance and the cost effectiveness of the power converter.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A power module, comprising:
a first power chip and a second power chip, each of which is molded in the same molding material and has at least two electrodes, wherein at least one of the power chips has at least three electrodes, and at least one of the power chips operates at a frequency higher than or equal to 25 kHz,
wherein the power module is applied to a power converter, an operation voltage of at least one of the power chips in the power converter is higher than 48 volts, the power converter has a power density and a maximum efficiency respectively higher than 15 W/inch$^3$ and 92%, or has the power density higher than 20 W/inch$^3$ or the maximum efficiency of the power converter higher than 93%, a total volume ratio of the power module to the power converter is smaller than 50%, a ratio of an electric energy converting stage processing power of the power converter using the power module to a total output power of the power converter is higher than or equal to 30%, and the total output power of the power converter is higher than or equal to 150 W.

2. The power module according to claim 1, wherein the power converter is an isolated AC/DC power, or a non-isolated AC/DC power converter, or an isolated DC/DC converter or a DC/AC converter, and the power converter has the power density and the maximum efficiency respectively higher than 20 W/inch$^3$ and higher than 93%, or the power density higher than 25 W/inch$^3$, or the maximum efficiency higher than 94%.

3. The power module according to claim 1, wherein when the power module is mounted upright on a surface of a circuit board, a height from a highest point of the power module to the surface of the circuit board is smaller than or equal to 35 mm, wherein a total thickness of the power module is smaller than 6 mm.

4. The power module according to claim 3, wherein the height from the highest point of the power module to the surface of the circuit board is greater than or equal to 21 mm.

5. The power module according to claim 3, wherein a pin of the power module projects beyond a bottom of the power module and stands upright on the circuit board.

6. The power module according to claim 4, having a front surface and a rear surface, wherein in a heat dissipating environment with a balanced and parallel airflow speed of 5 m/s, a maximum temperature difference between points in at least 80% of areas of the front surface and the rear surface of the power module is smaller than 20% of an average temperature rise between a working environment and the front and rear surfaces.

7. The power module according to claim 5, wherein the power converter has the power density and the maximum efficiency respectively higher than 25 W/inch$^3$ and higher than 95%, or the power density higher than 30 W/inch$^3$, or the maximum efficiency higher than 96%.

8. The power module according to claim 7, wherein the operation voltage of at least one of the power chips in the power converter is higher than 200 volts.

9. The power module according to claim 5, wherein a width of the power module is smaller than 60 mm, a pin gap ranges from 3 mm to 5 mm at the operation voltage of 400 volts, and the pin gap ranges from 0.5 mm to 2 mm at the operation voltage of 30 volts.

10. The power module according to claim 1, further comprising:
a first heat sink, wherein the first power chip and the second power chip are disposed above the first heat sink;
a lead frame electrically connected to at least one of the first power chip and the second power chip; and
a molding material covering the first power chip, the second power chip and one portion of the lead frame.

11. The power module according to claim 10, wherein the first heat sink has a first area and a second area, the first power chip is disposed in the first area, and the power module further comprises:
a thermo-conductive insulating layer disposed in the second area and having an insulating layer, wherein the second power chip is disposed above the first heat sink through the thermo-conductive insulating layer;
wherein the molding material further covers one portion of the thermo-conductive insulating layer; and
the first heat sink electrically connected to at least one of the first power chip and the second power chip.

12. The power module according to claim 10, wherein the first heat sink and the lead frame are integrally formed as one piece.

13. The power module according to claim 10, wherein the first heat sink is entirely disposed within molding compound, partially outside the molding compound or entirely outside the molding compound.

14. The power module according to claim 10, wherein the first heat sink is connected to a pin penetrating through the molding compound, or the first heat sink penetrates through the molding compound and is formed with a pin.

15. The power module according to claim 14, wherein the first heat sink is electrically connected to a voltage static location.

16. The power module according to claim 10, wherein the first heat sink is divided into a plurality of portions.

17. The power module according to claim 10, wherein the thermo-conductive insulating layer has a trace layer, and the lead frame extends and is connected to the trace layer.

18. The power module according to claim 10, wherein the lead frame extends and is connected to at least one of the first power chip and the second power chip.

19. The power module according to claim 11, further comprising:
a second heat sink disposed between the second power chip and the thermo-conductive insulating layer.

20. The power module according to claim 10, further comprising:
a third heat sink, which is disposed in the first area or is formed by extending the first heat sink.

21. The power module according to claim 20, wherein the third heat sink penetrates through the molding compound.

22. The power module according to claim 21, wherein the third heat sink penetrates through the molding compound and has a bend.

23. The power module according to claim 21, further comprising:
a fourth heat sink connected to the third heat sink, wherein a gap is formed between the fourth heat sink and the molding compound.

24. The power module according to claim 11, wherein the thermo-conductive insulating layer is a metal substrate or a metalized ceramic substrate.

25. The power module according to claim 11, further comprising:
a bonding material layer, through which the first power chip is connected to the first heat sink, wherein the bonding material layer has a coefficient of heat conductivity higher than or equal to 2 W/m·K.

26. The power module according to claim 10, further comprising one row of pins penetrating through the molding material and functioning to transmit signals or dissipate heat.

27. The power module according to claim 26, wherein a sum of heat dissipating amounts of the row of pins is greater than or equal to 5% of a total heat dissipating amount of the power module.

28. The power module according to claim 11, further comprising:
a controller disposed in the first area.

29. The power module according to claim 28, further comprising:
a heat insulating layer disposed between the controller and the first heat sink.

30. The power module according to claim 1, further comprising:
a high-frequency capacitor integrated within the power module.

31. The power module according to claim 1, further comprising:
a temperature sensor integrated within the power module.

32. The power module according to claim 10, wherein a thickness of the first heat sink is higher than 20% of a thickness of the power module.

33. The power module according to claim 32, wherein the thickness of the first heat sink is smaller than 3 mm.

34. The power module according to claim 10, wherein a gap between the molding material and the first power chip or the second power chip is smaller than 60% of a thickness of the power module and smaller than 3 mm.

35. The power module according to claim 11, wherein the thermo-conductive insulating layer has thermal resistances, which are smaller than 3 K/W, above and below a 10×10 area.

36. The power module according to claim 1, further comprising:
a third power chip disposed above the second power chip;
a fourth power chip disposed above the first power chip;
a lead frame disposed between the first power chip and the fourth power chip, disposed between the second power chip and the third power chip, and disposed above the third power chip and the fourth power chip; and
a molding material covering the power chips and at least one portion of the lead frame.

37. The power module according to claim 1, wherein the power converter comprises at least two of the power modules.

38. The power module according to claim 37, wherein the two power modules are molded by the same molding material.

39. The power module according to claim 10, wherein the molding compound has a coefficient of heat conductivity higher than 1.2 W/m·K.

40. The power module according to claim 10, wherein the molding compound has a coefficient of heat conductivity higher than 1.8 W/m·K.

* * * * *